United States Patent
Asada et al.

(10) Patent No.: US 9,698,091 B2
(45) Date of Patent: Jul. 4, 2017

(54) POWER SEMICONDUCTOR DEVICE

(71) Applicant: Mitsubishi Electric Corporation, Tokyo (JP)

(72) Inventors: Shinsuke Asada, Tokyo (JP); Naoki Yoshimatsu, Tokyo (JP); Yuji Imoto, Tokyo (JP); Yusuke Ishiyama, Tokyo (JP); Junji Fujino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 164 days.

(21) Appl. No.: 14/754,167

(22) Filed: Jun. 29, 2015

(65) Prior Publication Data
US 2016/0104651 A1 Apr. 14, 2016

(30) Foreign Application Priority Data
Oct. 9, 2014 (JP) ................. 2014-207761

(51) Int. Cl.
*H05K 7/00* (2006.01)
*H01L 23/498* (2006.01)
(Continued)

(52) U.S. Cl.
CPC .... *H01L 23/49827* (2013.01); *H01L 23/3735* (2013.01); *H01L 23/49811* (2013.01); *H01L 24/37* (2013.01); *H01L 24/40* (2013.01); *H01L 23/057* (2013.01); *H01L 23/24* (2013.01); *H01L 23/295* (2013.01); *H01L 25/072* (2013.01); *H01L 2224/29111* (2013.01); *H01L 2224/32225* (2013.01); *H01L 2224/33181* (2013.01); *H01L 2224/37011* (2013.01); *H01L 2224/40095* (2013.01); *H01L 2224/45124* (2013.01);
(Continued)

(58) Field of Classification Search
CPC .... H05K 1/141; H05K 1/0231; H01L 23/427; H01L 23/467–23/473; H01L 23/4006; H01L 2224/48091
USPC .............. 361/700–707, 764–784, 813; 257/685–686, 700–730
See application file for complete search history.

(56) References Cited

U.S. PATENT DOCUMENTS 6,212,087 B1 * 4/2001 Grant ................... H02M 7/003
361/707
7,767,905 B2 * 8/2010 Meyer ................... H02G 3/086
174/135

(Continued)

FOREIGN PATENT DOCUMENTS

| JP | 2003-318344 A | 11/2003 |
|---|---|---|
| JP | 2013-069825 A | 4/2013 |
| JP | 2014-103182 A | 6/2014 |

*Primary Examiner* — Tuan T Dinh
(74) *Attorney, Agent, or Firm* — Studebaker & Brackett PC

(57) ABSTRACT

A power semiconductor device includes an insulating substrate, a semiconductor element, a case, and a wiring member. The case forms a container body having a bottom surface defined by a surface of the insulating substrate, to which said semiconductor element is bonded. The wiring member has a bonding portion positioned above an upper surface electrode of the semiconductor element. The bonding portion of the wiring member is provided with a projection portion projecting toward the upper surface electrode of the semiconductor element and bonded to the upper surface electrode with a solder, and a through hole passing through the bonding portion in a thickness direction through the projection portion.

8 Claims, 3 Drawing Sheets

(51) Int. Cl.
*H01L 23/00* (2006.01)
*H01L 23/373* (2006.01)
*H01L 23/057* (2006.01)
*H01L 23/29* (2006.01)
*H01L 25/07* (2006.01)
*H01L 23/24* (2006.01)

(52) U.S. Cl.
CPC ............ *H01L 2224/73213* (2013.01); *H01L 2224/73215* (2013.01); *H01L 2224/73221* (2013.01); *H01L 2224/73263* (2013.01); *H01L 2224/73265* (2013.01); *H01L 2924/13055* (2013.01); *H01L 2924/181* (2013.01)

(56) References Cited

U.S. PATENT DOCUMENTS

| | | | | |
|---|---|---|---|---|
| 8,334,598 B2 * | 12/2012 | Nishibori | ............ | B23K 35/262 257/737 |
| 2008/0012045 A1 * | 1/2008 | Muto | ............ | H01L 21/565 257/177 |
| 2011/0089558 A1 * | 4/2011 | Muto | ............ | H01L 24/40 257/712 |
| 2013/0181228 A1 * | 7/2013 | Usui | ............ | H01L 23/4334 257/77 |
| 2014/0284809 A1 * | 9/2014 | Yoneguchi | ............ | H01L 24/13 257/773 |

* cited by examiner

F I G . 3
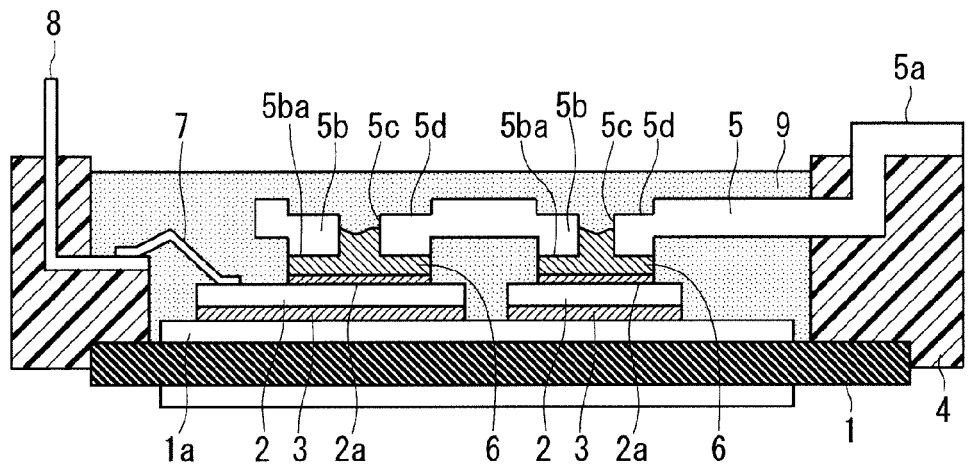
F I G . 4
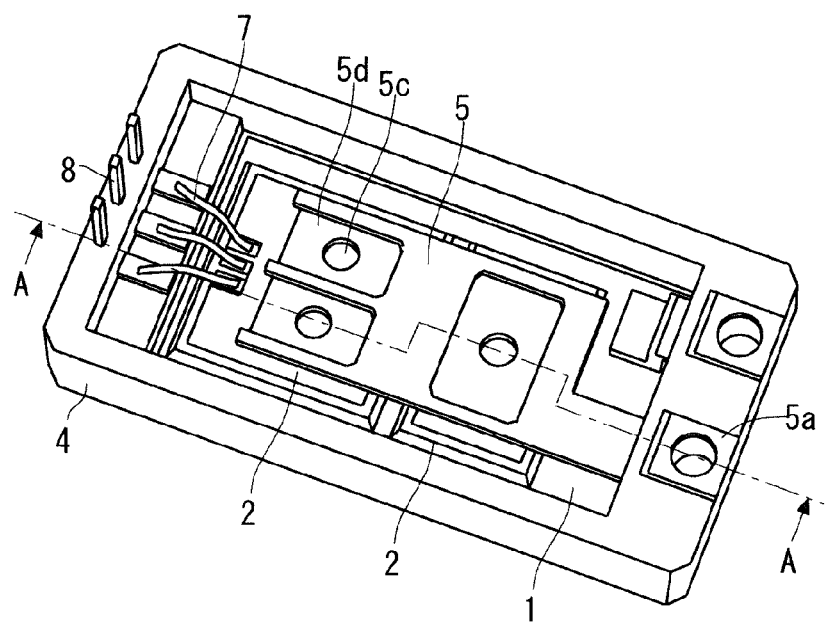

POWER SEMICONDUCTOR DEVICE

BACKGROUND OF THE INVENTION

Field of the Invention

The present invention relates to a power semiconductor device and more particularly to a power semiconductor device including a semiconductor element and a wiring member connected with a solder.

Description of the Background Art

A general power semiconductor device has been conventionally manufactured in such a manner that, a lower surface electrode formed on a lower surface of a semiconductor element is bonded to a circuit pattern on an insulating substrate, and an upper surface electrode formed on an upper surface of the semiconductor element is electrically connected to another semiconductor element or an external terminal through an ultrasonic bonding wire made of aluminum. After that, sealing with a molding resin, or filling with a sealing member is performed.

However, in the case of the wire bonding, since an allowable current per wire is limited, the number of the wires needs to be increased in a power semiconductor device having a large-current circuit, which hampers productivity. Thus, according to a proposed method for wiring the large-current circuit to enhance the productivity, a plate-shaped wiring member formed by pressing a metal plate is bonded to the upper surface electrode of the semiconductor element with a solder (refer to Japanese Patent Application Laid-Open No. 2013-69825).

According to the power semiconductor device having the plate-shape wiring member described above, the plate-shape wiring member is arranged so as to cover the upper surface of the semiconductor element. Therefore, the problem is that a gap where the sealing member is unlikely to be filled is formed in a region not provided with the solder between the wiring member and the semiconductor element. In addition, in a case where the solder unnecessarily wets and spreads, the gap between the wiring member and the semiconductor element becomes narrower, so that the problem is that the sealing member is further unlikely to be filled.

Here, as for a case type power semiconductor device, unlike a mold type, it is difficult to apply a pressure with a die when the sealing member is filled, and penetration (filling) of the sealing member into the gap relies on natural penetrability, so that the sealing member is unlikely to be filled compared with the mold type. Especially, regarding to the above device, that is to say, a device in which the wiring member is integrated with the case, the wiring member is likely to be inclined depending on an assembled state of the case, and a distance between the semiconductor element and the wiring member is likely to vary. Therefore, the distance is likely to become small, which causes an oversupply of the solder and the solder is likely to wet and spread to an outside of a bonding region. As a result, the sealing member is more unlikely to be filled.

Here, in the case where the sealing member has not been filled in the gap for the above reason, in addition to causing an insulating property to be reduced as a matter of course, there is a reduction in mechanical strength of the sealing member for holding a bonding section between the wiring member and the semiconductor element. As a result, the semiconductor element and the solder bonding section cannot endure a thermal stress generated due to a change in temperature, and the problem is that the reliability is reduced.

Thus, in order to prevent the solder from wetting and spreading as described above, Japanese Patent Application Laid-Open No. 2013-69825 proposes a configuration in which a projection smaller than the upper surface electrode of the semiconductor element is provided in the wiring member. According to this configuration, since the oversupplied solder can be absorbed to a side of the projection as a fillet, the solder can stay in an inside of the upper surface electrode. However, the oversupplied solder still unnecessarily wets and spreads, and the sealing member is not sufficiently filled in some cases.

SUMMARY OF THE INVENTION

The present invention has been made in view of the above problems, and it is an object of the present invention to provide a technique capable of enhancing filling efficiency of a sealing member.

A power semiconductor device according to an aspect of the present invention includes an insulating substrate, a semiconductor element, a case, a plate-shape wiring member, and a sealing member. The semiconductor element has a lower surface bonded to the insulating substrate, and an upper surface having an electrode. The case forms a container body having a bottom surface defined by a surface of the insulating substrate, to which the semiconductor element is bonded. The wiring member has a first portion integrated with the case, and a second portion positioned above the electrode of the semiconductor element in the container body, and extends sideward. The sealing member is filled in the container body to cover the wiring member in the container body. The second portion of the wiring member is provided with a projection portion projecting toward the electrode of the semiconductor element and bonded to the electrode with a solder, and a through hole passing through the second portion in a thickness direction through the projection portion.

The gap where the sealing member is unlikely to be filled can be prevented from generating between the semiconductor element and the wiring member, so that the filling efficiency of the sealing member can be enhanced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a cross-sectional view illustrating the configuration of the power semiconductor device according to the first preferred embodiment;

FIG. 4 is a perspective view illustrating a part of a configuration of a power semiconductor device according to a variation;

DESCRIPTION OF THE PREFERRED EMBODIMENTS

<First Preferred Embodiment>

Figure 1:
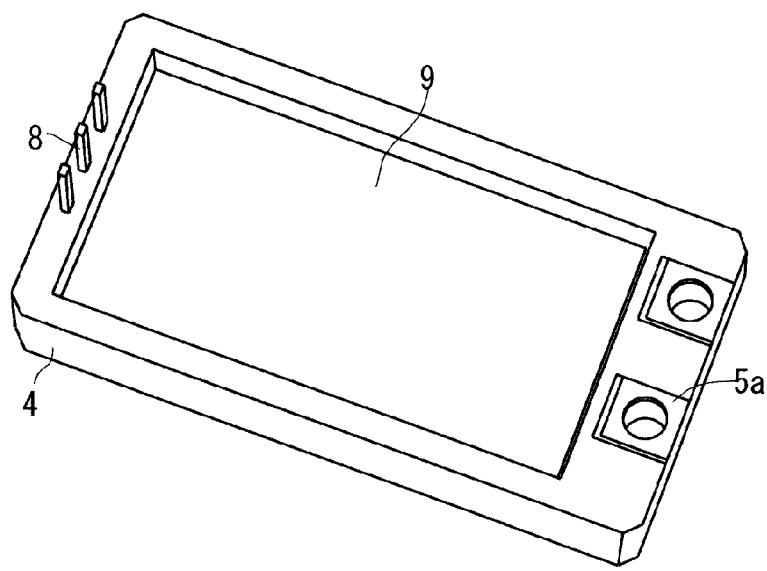
FIG. 1 is a perspective view illustrating a configuration of a power semiconductor device according to a first preferred embodiment.
Figure 2:
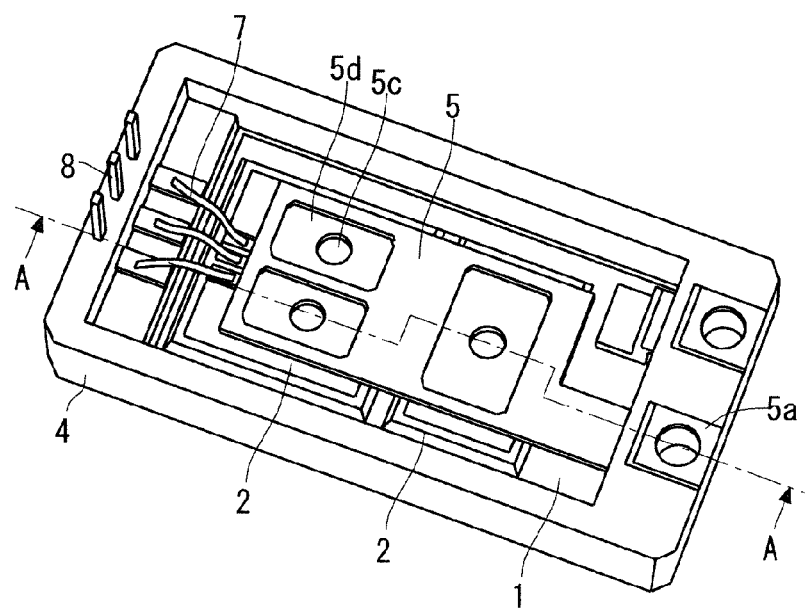
FIG. 2 is a perspective view illustrating a part of the configuration of the power semiconductor device according to the first preferred embodiment.

A power semiconductor device according to the first preferred embodiment of the present invention will be described with reference to FIGS. 1 to 3. FIG. 1 is a perspective view illustrating a configuration of the power semiconductor device, and FIG. 2 is a perspective view not illustrating a sealing member 9 from the configuration in FIG. 1, for convenience of the description. FIG. 3 is a cross-sectional view illustrating a configuration along a line A-A in FIG. 2.

As illustrated in FIGS. 1 to 3, the power semiconductor device according to the first preferred embodiment includes an insulating substrate 1, a semiconductor element 2, a bonding member 3 such as a solder, a case 4, a wiring member 5, a solder 6, a wire 7, an external signal terminal 8, and the sealing member 9.

A circuit pattern 1a is provided on an upper surface (one surface) of the insulating substrate 1.

The semiconductor element 2 is an element such as a diode or an insulated gate bipolar transistor (IGBT). According to this first preferred embodiment, the semiconductor element 2 is to be used in an inverter for controlling a vehicle motor, or a converter for regenerating a vehicle. The vehicle in this specification includes an electric automobile and an electric train.

A lower surface of the semiconductor element 2 is bonded to the circuit pattern 1a with the bonding member 3. That is, the semiconductor element 2 is bonded to the insulating substrate 1 through the circuit pattern 1a and the bonding member 3. Furthermore, according to the first preferred embodiment, the two semiconductor elements 2 are bonded to the insulating substrate 1.

An upper surface of each of the semiconductor elements 2, serving as an opposite surface of the lower surface bonded to the insulating substrate 1 has an upper surface electrode 2a formed as an electrode. The one or more upper surface electrodes 2a may be provided on the one semiconductor element 2. In addition, a metal film made of gold, nickel, or titanium, for example, may be formed on a surface of the upper surface electrode 2a to improve bonding with the solder 6.

The case 4 is a peripheral wall body which surrounds an outer periphery of the semiconductor element 2. According to the first preferred embodiment, the case 4 is mounted on the insulating substrate 1 to form a container body in which its bottom surface is the surface of the insulating substrate 1, to which the semiconductor element 2 is bonded. The container body formed here does not have a lid. The case 4 is made of a thermoplastic resin such as polyphenylenesulfide (PPS) or polybutylene terephthalate (PBT).

The wiring member 5 has a plate shape formed by pressing, for example, and extends sideward. Here, the wiring member 5 extends parallel to the insulating substrate 1 and the semiconductor element 2. The wiring member 5 is made of copper, aluminum, or a compound material of those, for example.

The wiring member 5 has one end portion (first portion) integrated with the case 4. According to the first preferred embodiment, a tip end of the one end portion of the wiring member 5 is exposed from an upper surface of the case 4 and used as a connection terminal 5a to be connected to an outside.

In addition, the wiring member 5 has a bonding portion (second portion) positioned above the upper surface electrode 2a of the semiconductor element 2, in the container body composed of the insulating substrate 1 and the case 4. According to the first preferred embodiment, the wiring member 5 has the bonding portion with respect to each upper surface electrode 2a, and the one of the bonding portions is arranged near the other end of the wiring member 5. The bonding portion of the wiring member 5 will be described in detail below.

The solder 6 bonds the upper surface electrode 2a of the semiconductor element 2 to the bonding portion of the wiring member 5. Thus, the semiconductor element 2 is electrically connected to the wiring member 5. According to the first preferred embodiment, the one semiconductor element 2 is electrically connected to the other semiconductor element 2 through the solder 6 and the wiring member 5. Furthermore, a material of the solder 6 is not particularly limited, and includes SnAgCu series, SnCu series, and SnSb series, for example.

The external signal terminal 8 is made of the similar material by the similar process to the wiring member 5, for example. The external signal terminal 8 is integrated with the case 4 similarly to the wiring member 5. Thus, one end portion of the external signal terminal 8 is connected to the one semiconductor element 2 through a wire 7, and the other end portion of the external signal terminal 8 is exposed from the upper surface of the case 4, and used as a connection terminal to be connected to the outside.

The sealing member 9 is filled in the container body composed of the insulating substrate 1 and the case 4 to cover the wiring member 5, the circuit pattern 1a of the insulating substrate 1, the semiconductor element 2, and the solder 3 in the container body.

The sealing member 9 is made of a thermosetting resin such as an epoxy resin and contains powder (filler) such as silica as needed, to adjust a mechanical property. The sealing member 9 protects the circuit member from contamination and impact, and secures an insulating property. Furthermore, the sealing member 9 holds a bonding section between the wiring member 5 or the insulating substrate 1, and the semiconductor element 2, and prevents damage from being caused by a thermal stress generated because of a difference in thermal expansion rate between the wiring member 5 or the insulating substrate 1, and the semiconductor element 2. Therefore, when the sealing member 9 is appropriately filled, and the sealing member 9 sufficiently holds the bonding section, reliability of the power semiconductor device can be improved.

<Bonding Portion of Wiring Member 5>

Next, a detailed description will be given to the bonding portion positioned above the upper surface electrode 2a, of the semiconductor element 2.

The bonding portion of the wiring member 5 is provided with a projection portion 5b projecting toward the upper surface electrode 2a of the semiconductor element 2, and the projection portion 5b is bonded to the upper surface electrode 2a with the solder 6. According to the first preferred embodiment, a tip end of the projection portion 5b in the wiring member 5 includes a planar portion 5ba forming a step with respect to the wiring member 5 except for the projection portion 5b. In addition, an outer periphery shape of the projection portion 5b (planar portion 5ba) roughly coincides with an outer periphery shape of the upper surface electrode 2a of the semiconductor element 2, so that an outer periphery of the upper surface electrode 2a of the semiconductor element 2 is aligned with an outer periphery of the projection portion 5b of the wiring member 5. In addition, the projection portion 5b having a shape of a step in cross-sectional view can be formed by pressing such as half-blanking. A height of the projection portion 5b is favorably limited to a roughly half of a plate thickness in view of process limitation, but not limited to this.

The bonding portion of the wiring member 5 is provided with a through hole 5c passing through the bonding portion in a thickness direction through the projection portion 5b (planar portion 5ba). In addition, the wiring member 5 has a recessed portion 5d leading to the through hole 5c, on a surface (upper surface) opposite to the surface of the projection portion 5b.

<Conclusion of First Preferred Embodiment>

An actual manufacturing process has limitations in processing accuracy of the wiring member 5, dimensional accuracy of the case 4 integrated with the wiring member 5, and assembly accuracy between the case 4 and the insulating substrate 1. Therefore, it is difficult to uniformly keep a distance between the upper surface electrode 2a of the semiconductor element 2, and the projection portion 5b (planar portion 5ba) of the wiring member 5, that is, a thickness of the solder 6, so that the distance varies. However, it is not a realistic way to individually measure the variation in the distance, and individually adjust an amount of the solder 6 based on the measured result because productivity is reduced.

Meanwhile, according to the power semiconductor device in the first preferred embodiment, even when the distance becomes smaller than assumed, and the solder 6 is oversupplied, the oversupplied solder can be allowed to escape to the through hole 5c provided in the wiring member 5. Therefore, even when the distance varies, the solder 6 can be prevented from wetting and spreading to an outside of the upper surface electrode 2a and the projection portion 5b (planar portion 5ba). Therefore, a gap which is difficult to be filled with the sealing member 9 can be prevented from generating between the semiconductor element 2 and the wiring member 5, so that filling efficiency of the sealing member 9 can be enhanced. As a result, the highly-reliable power semiconductor device can be achieved.

In addition, according to the first preferred embodiment, the tip end of the projection portion 5b includes the planar portion 5ba. Therefore, the solder 6 can be prevented from wetting and spreading to the outside of the upper surface electrode 2a and the projection portion 5b (planar portion 5ba) due to an edge effect. Therefore, the gap can be further prevented from generating, so that the filling efficiency of the sealing member 9 can be further enhanced.

Furthermore, according to the first preferred embodiment, the projection portion 5b projects toward the upper surface electrode 2a, and the outer periphery of the upper surface electrode 2a of the semiconductor element 2 is aligned with the outer periphery of the projection portion 5b of the wiring member 5. Thus, the gap between the wiring member 5 and the semiconductor element 2, provided in a region just outside of a peripheral line of the upper surface electrode 2a and the projection portion 5b (planar portion 5ba) can be thick. Therefore, the sealing member 9 can be likely to be filled in the gap between the wiring member 5 and the semiconductor element 2, so that the filling efficiency of the sealing member 9 can be further enhanced.

Furthermore, according to the first preferred embodiment, the recessed portion 5d leading to the through hole 5c is provided on the surface (upper surface) opposite to the surface of the projection portion 5b in the wiring member 5. Thus, the solder 6 allowed to escape to the through hole 5c is stored in the recessed portion 5d even when it tries to rise from an upper surface of the wiring member 5. As a result, it is not necessary to increase a thickness more than needs of the sealing member 9 to cover the wiring member 5 in the container body, so that the device can be expected to be downsized.

<Variation of First Preferred Embodiment>

Figure 5:
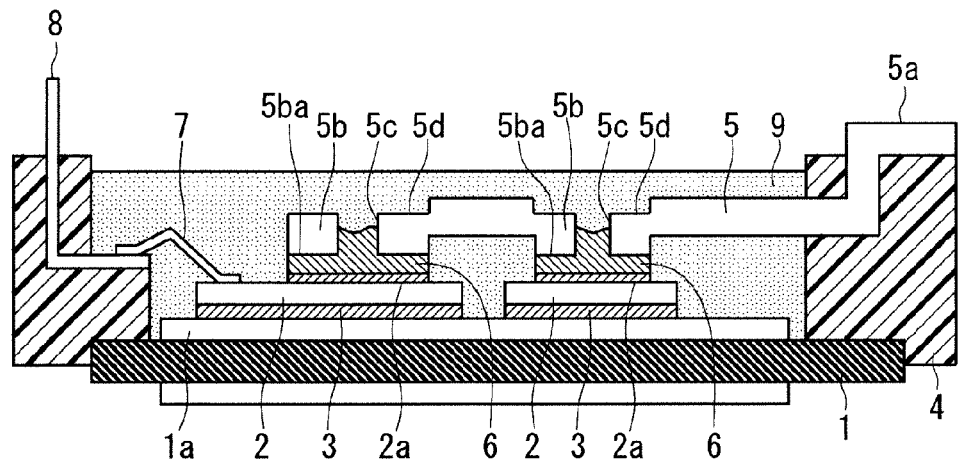
FIG. 5 is a cross-sectional view illustrating the configuration of the power semiconductor device according to the variation.

FIG. 4 is a perspective view of a configuration of a power semiconductor device according to the variation of the first preferred embodiment in which the sealing member 9 is not illustrated similarly to FIG. 2, and FIG. 5 is a cross-sectional view illustrating a configuration taken along a line A-A in FIG. 4.

The power semiconductor device according to this variation has the configuration similar to the first preferred embodiment illustrated in FIGS. 1 to 3. However, according to the power semiconductor device in this variation, the projection portion 5b is provided such that a part of a periphery of the projection portion 5b (one side of a roughly rectangular shape in this case) is aligned with the other end of the wiring member 5. According to the power semiconductor device in this variation, an area of the semiconductor element 2 covered with the wiring member 5 is reduced, that is, an area of a gap formed between the semiconductor element 2 and the wiring member 5 is reduced, so that filling efficiency of the sealing member 9 can be enhanced.

<Second Preferred Embodiment>

Figure 6:
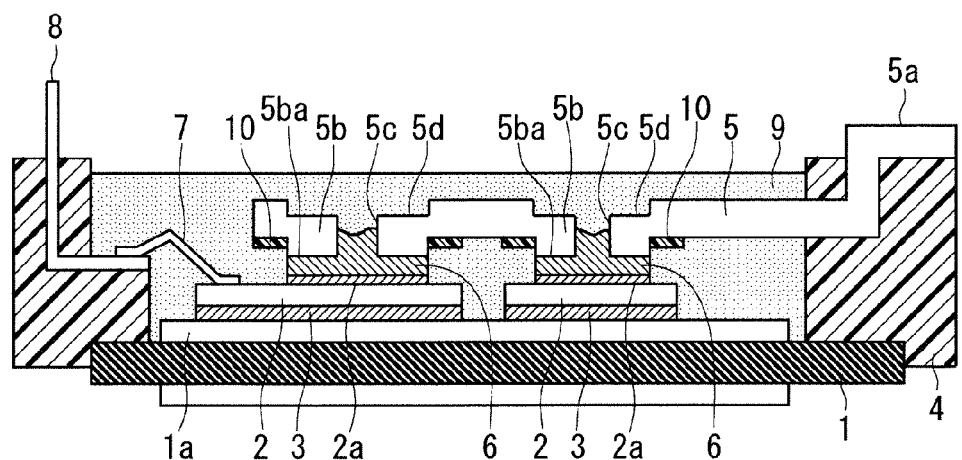
FIG. 6 is a cross-sectional view illustrating a configuration of a power semiconductor device according to a second preferred embodiment.

FIG. 6 is a cross-sectional view illustrating a configuration of a power semiconductor device according to the second preferred embodiment of the present invention, taken along a line A-A in FIG. 2 similar to FIG. 3 in the first preferred embodiment. In addition, in the power semiconductor device according to the second preferred embodiment, the same reference mark is given to the same or similar component to that described in the above, and different portion will be mainly described.

According to the power semiconductor device in the second preferred embodiment, a solder resist 10 serving as a film made of a material with which the solder 6 is not likely to wet is added to the configuration of the first preferred embodiment. The solder resist 10 is provided adjacently to the outer periphery of the projection portion 5b of the wiring member 5. According to the second preferred embodiment, the solder resist 10 is formed at least in a region surrounding the projection portion 5b, on the lower surface having the projection portion 5b, in the wiring member 5.

According to the power semiconductor device in the second preferred embodiment, the solder 6 can be prevented from wetting and spreading to the outside of the projection portion 5b, due to the solder resist 10. As a result, the gap in which the sealing member 9 is unlikely to be filled can be further prevented from generating, so that the filling efficiency of the sealing member 9 can be further enhanced.

<Variation of First and Second Preferred Embodiments>

According to the first and second preferred embodiments described above, the semiconductor element 2 is made of Si (silicon). However, instead of this, the semiconductor element 2 may be made of a semiconductor having a wide bandgap (wide bandgap semiconductor). This material includes silicon carbide (SiC), gallium nitride (GaN), and diamond, for example.

According to the power semiconductor device having that semiconductor element 2, an operation can be performed at high temperature. In addition, it is supposed that a thermal stress applied to the semiconductor element 2 is increased in association with the operation at high temperature, but according to the configurations of the first and second preferred embodiments, the filling efficiency of the sealing member 9 can be enhanced in the gap between the semiconductor element 2 and the wiring member 5, so that the reliability and insulating property can be ensured. Therefore, the technique described above is especially effective in the case where the semiconductor element 2 is made of the wide bandgap semiconductor.

Furthermore, according to the first and second preferred embodiments described above, the power semiconductor device is the case type in which the semiconductor element 2 is surrounded by the case 4 and sealed with the sealing member 9. However, instead of this, the power semiconductor device may be a mold type in which its outer shape is molded with a die.

However, as for the case type power semiconductor device, unlike the mold type, it is difficult to apply a pressure with a die when the sealing member 9 is filled, penetration (filling) of the sealing member 9 into the gap relies on natural penetrability, so that the sealing member 9 is not likely to be filled compared with the mold type. Therefore, the technique described above is especially effective in the case type power semiconductor device described in the first and second preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:
   an insulating substrate;
   a semiconductor element having a lower surface bonded to said insulating substrate, and an upper surface having an electrode;
   a case forming a container body having a bottom surface defined by a surface of said insulating substrate, to which said semiconductor element is bonded;
   a plate-shape wiring member having a first portion integrated with said case, and a second portion positioned above said electrode of said semiconductor element in said container body, and extending sideward; and
   a sealing member filled in said container body to cover said wiring member in the container body, wherein
   said second portion of said wiring member is provided with a projection portion projecting toward said electrode of said semiconductor element and bonded to the electrode with a solder and a through hole passing through said second portion in a thickness direction through said projection portion.

2. The power semiconductor device according to claim 1, wherein
   a tip end of said projection portion in said wiring member includes a planar portion forming a step with respect to said wiring member except for the projection portion.

3. The power semiconductor device according to claim 1, wherein
   a recessed portion leading to said through hole is provided on a surface opposite to a surface having said projection portion, in said wiring member.

4. The power semiconductor device according to claim 1, further comprising:
   a solder resist provided adjacently to an outer periphery of said projection portion of said wiring member.

5. The power semiconductor device according to claim 1, wherein
   an outer periphery of said electrode of said semiconductor element is aligned with an outer periphery of said projection portion of said wiring member.

6. The power semiconductor device according to claim 1, wherein
   said semiconductor element is made of a wide bandgap semiconductor.

7. The power semiconductor device according to claim 1, wherein
   said semiconductor element is used in an inverter for controlling a vehicle motor, or a converter for regenerating a vehicle.

8. The power semiconductor device according to claim 1, wherein said first portion integrated with said case is exposed to an outside of said case.

\* \* \* \* \*